(12) United States Patent
Churchill

(10) Patent No.: US 6,981,238 B1
(45) Date of Patent: Dec. 27, 2005

(54) VERIFICATION OF INTEGRATED CIRCUIT DESIGNS USING BUFFER CONTROL

(75) Inventor: Jonathan F. Churchill, Reading (GB)

(73) Assignee: Cypress Semiconductor Corporation, San Jose, CA (US)

( * ) Notice: Subject to any disclaimer, the term of this patent is extended or adjusted under 35 U.S.C. 154(b) by 123 days.

(21) Appl. No.: 10/277,541

(22) Filed: Oct. 22, 2002

(51) Int. Cl.[7] .............................................. G06F 17/50
(52) U.S. Cl. .............................. 716/15; 716/1; 716/11; 703/14
(58) Field of Search .......................... 365/203; 703/14; 716/2, 5, 6, 8, 14–17, 3, 18, 1, 11

(56) References Cited

U.S. PATENT DOCUMENTS

| | | | |
|---|---|---|---|
| 6,104,653 A * | 8/2000 | Proebsting | 365/203 |
| 6,286,126 B1 | 9/2001 | Raghavan et al. | |
| 6,438,729 B1 | 8/2002 | Ho | |
| 6,467,073 B1 * | 10/2002 | Merchant | 716/16 |
| 6,507,932 B1 * | 1/2003 | Landry et al. | 716/3 |
| 6,530,073 B2 * | 3/2003 | Morgan | 716/18 |
| 6,550,046 B1 * | 4/2003 | Balasa et al. | 716/8 |

OTHER PUBLICATIONS

Dimitri Doukas, et al., "CLOVER: A Timing Constraints Verification System"; 1991 ACM/IEEE Design Automation Conference, pp. 662-667; Dept. of Computer Science, Princeton Univ., New Jersey.

* cited by examiner

*Primary Examiner*—Thuan Do
(74) *Attorney, Agent, or Firm*—Okamoto & Benedicto LLP

(57) ABSTRACT

In one embodiment, a schematic for a net includes a load and a load schematic. The load schematic may include a parasitic on the net, and an equivalent of the load. A buffer may be employed to couple the load schematic to the schematic. Among other advantages, this simplifies comparison of parasitics between the schematic and a corresponding layout.

8 Claims, 9 Drawing Sheets

VERIFICATION OF INTEGRATED CIRCUIT DESIGNS USING BUFFER CONTROL

BACKGROUND OF THE INVENTION

1. Field of the Invention

The present invention relates generally to electrical circuit design, and more particularly but not exclusively to techniques for verifying the design of an integrated circuit.

2. Description of the Background Art

Integrated circuits are typically designed using software referred to as "IC design tools." IC design tools are available for schematic entry, simulation, layout creation, and verification. An integrated circuit design process may include an engineer creating a circuit schematic. A circuit schematic is a diagram depicting the components of the design and the wires connecting the components. A netlist, which is a listing of the components and wires of the design, may be generated from the circuit schematic.

A circuit layout is a diagram depicting physical representations of components and wires as they will be fabricated into an integrated circuit. To verify that a layout is consistent with its corresponding circuit schematic, a netlist listing the components and wires in the layout may be generated and compared to a netlist of the circuit schematic. The just mentioned verification process is referred to as an LVS (layout versus schematic) verification. From the layout, masks for fabricating an integrated circuit may be created.

A piece of wire connecting devices or points in an integrated circuit has associated capacitance, resistance, and inductance that are also referred to as "parasitics." Parasitics are affected by various factors including the wire's dimensions, material, routing, and load. As integrated circuit dimensions get smaller and signals get faster, the effects of parasitics on circuit performance become more significant. Using an IC design tool, parasitics may be extracted from the layout, and then incorporated into the circuit schematic using a process referred to as "back-annotation". The back-annotated circuit schematic may then be simulated to check if the resulting parasitics are within design constraints.

In some applications, such as custom integrated circuit design, the back-annotation process results in a lot of unexpected parasitics. In these applications, instead of back-annotating, a simulation schematic depicting hand-drawn estimates of the parasitics is created from the circuit schematic. To check if the layout meets design guidelines or if the simulation schematic can be relied on, a net extracted from a layout is compared to the same net extracted from the simulation schematic. One problem with this approach is that a netlist of the layout may be difficult to compare to a netlist of the simulation schematic. Another problem with this approach is that it is prone to schematic entry errors when a wire has several entry and exit points.

SUMMARY

In one embodiment, a schematic for a net includes a load and a load schematic. The load schematic may include a parasitic on the net, and an equivalent of the load. A buffer may be employed to couple the load schematic to the schematic. Among other advantages, this simplifies comparison of parasitics between the schematic and a corresponding layout.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided such as examples of circuits, components, and methods to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1A:
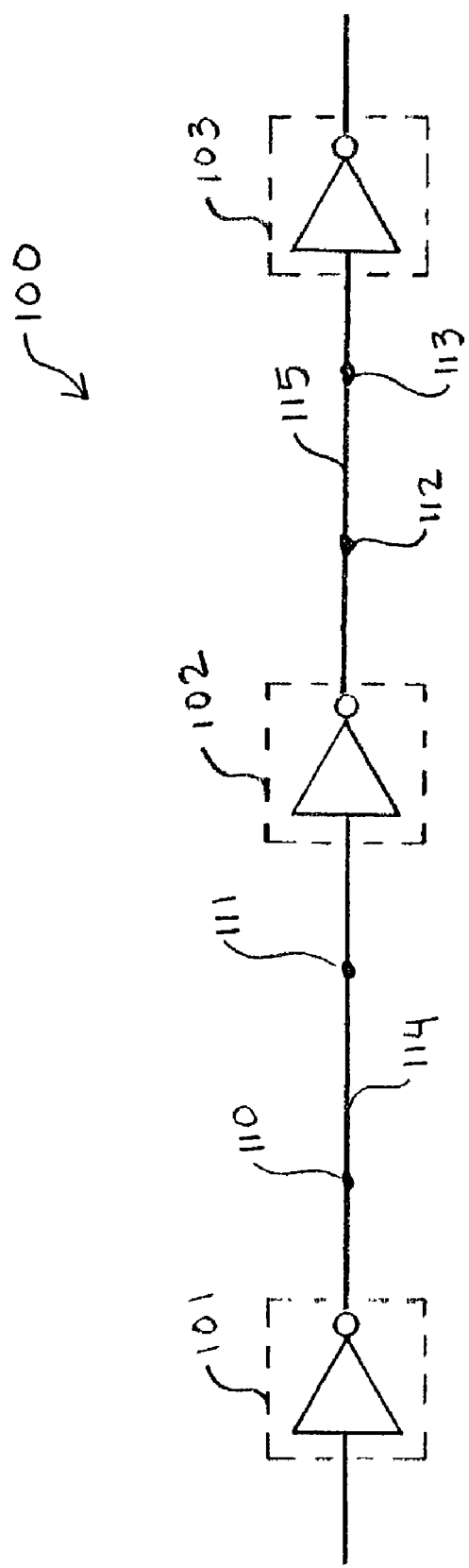
FIG. 1A shows a circuit schematic.

An embodiment of the present invention is now described with reference to FIGS. 1A, 1B, and 1C. FIG. 1A shows a circuit schematic 100. Circuit schematic 100 depicts components and wires of a particular integrated circuit design. In the example of FIG. 1A, circuit schematic 100 includes components 101, 102, and 103. Components 101, 102, and 103 are depicted as inverters in the example of FIG. 1A. Components 101, 102, and 103 may also be other types of components employed in an integrated circuit.

In FIG. 1A, a wire 114 between points 110 and 111 connects component 101 to component 102. Similarly, a wire 115 between points 112 and 113 connects component 102 to component 103. A net, in general, is a wire connecting components of an integrated circuit. A netlist of circuit schematic 100 would include a listing of wires 114 and 115, and a description of how they are connected to devices 101, 102, and 103.

A layout depicting a physical representation of circuit schematic 100 may be created using an IC design tool. Masks for fabricating an integrated circuit may be created from the layout. A netlist describing how components and wires in the layout are interconnected may also be generated using an IC design tool.

Figure 1B:
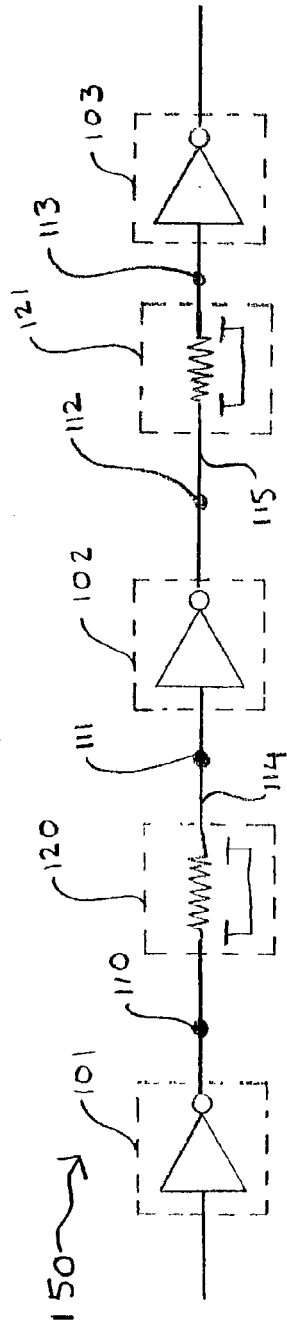
FIG. 1B shows a conventional simulation schematic for the circuit schematic of FIG. 1A.

FIG. 1B shows a conventional simulation schematic 150 for circuit schematic 100. Simulation schematic 150 takes into account the parasitics of wires 114 and 115, and may thus be used to simulate circuit schematic 100. In FIG. 1B, parasitics 120 and 121 represent the parasitics on wires 114 and 115, respectively. Parasitics 120 and 121 are depicted in FIG. 1B using "res-cap" symbols. A res-cap symbol may be resolved into a pi-network of resistance and capacitance. Parasitics 120 and 121 are typically, but not necessarily, hand estimates of resistance and capacitance on their respective wires. When employing embodiments of the invention, as in FIG. 1C, parasitics 120 and 121 may also include hand estimates of inductance on the wires. Each net (i.e., each wire) in simulation schematic 150 may be extracted and then compared to the same net extracted from the layout. For example, a netlist for wire 114 may be generated and then simulated. The result of the simulation may be compared to the result of simulating a netlist for the same wire extracted from the layout. This comparison process allows an engineer to check if the parasitics arising out of the layout are consistent with estimated parasitics reflected in the simulation schematic.

One problem with conventional simulation schematics like simulation schematic 150 is that parasitics extracted from the layout may be difficult to manually compare with parasitics depicted in the simulation schematic. Also, as will be discussed further below, conventional simulation schematics are prone to schematic entry error. Specifically, when a net has multiple entry and exit points, it is relatively easy to inadvertently leave out or include in parasitics and loads on the net. In accordance with an embodiment of the invention, the aforementioned problems are alleviated by using a load schematic that contains the parasitics and equivalent load on a net. Among other advantages, this allows the parasitics of a simulation schematic to be readily compared to those of a layout.

Figure 1C:
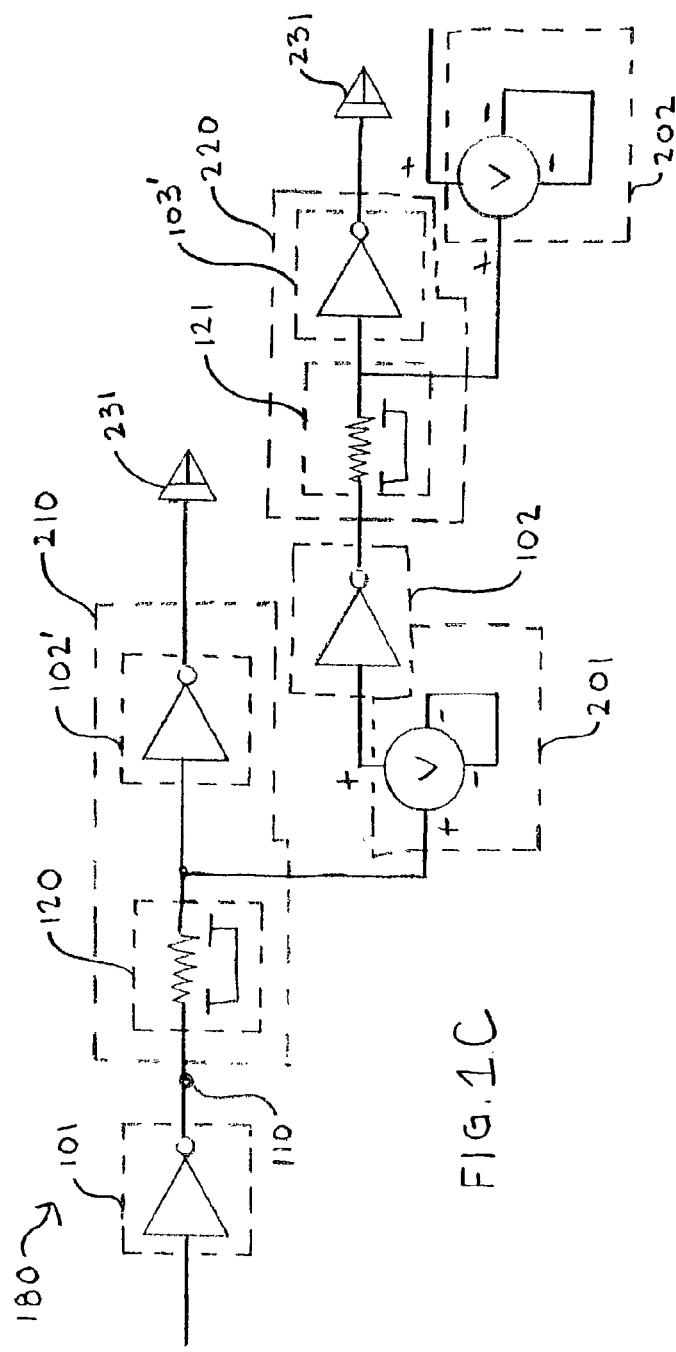
FIG. 1C shows a simulation schematic for the circuit schematic of FIG. 1A in accordance with an embodiment of the present invention.

FIG. 1C shows a simulation schematic 180 in accordance with an embodiment of the present invention. Like simulation schematic 150, simulation schematic 180 also includes parasitics 120 and 121, and components 101, 102, and 103 (not shown in FIG. 1C). In contrast to simulation schematic 150, however, simulation schematic 180 depicts the parasitics and loads on a given wire in a separate schematic referred to as a "load schematic." In FIG. 1C, a load schematic 210 includes parasitics 120 of wire 114 (see FIG. 1A) and an equivalent load 102'. Equivalent load 102' represents the load on wire 114, which in this example is component 102. Similarly, a load schematic 220 includes parasitics 121 of wire 115 (see FIG. 1A) and an equivalent load 103' representing the load on wire 115, which in this example is component 103. In one particular embodiment, a load schematic only contains the parasitics and loads on a single wire; parasitics and loads not on the net do not have to be reflected in the load schematic.

A load schematic may be coupled to a simulation schematic using a buffer, such as a voltage controlled voltage source (VCVS) with a gain of one. In FIG. 1C, unity-gain voltage controlled voltage sources are employed as buffers 201 and 202. Buffer 201 buffers load schematic 210 from component 102, while buffer 202 buffers load schematic 220 from component 103. Depending on the IC design tool employed, end-of-line terminators 231 may be placed on the outputs of the equivalent loads to indicate that there are no other components after them. Buffers 201 and 202 prevent equivalent loads 102' and 103' from adversely affecting a simulation including component 102 (i.e., a simulation not just involving a single net). Specifically, the buffers make the equivalent loads "transparent" in a simulation involving the entire simulation schematic.

As can be appreciated by those of ordinary skill in the art reading the present disclosure, the use of a load schematic to depict the parasitics and loads on a single net provides several advantages heretofore unrealized. Because the loads and parasitics on the net have been "compartmentalized" into the load schematic, the net as extracted from the load schematic may be readily compared to the same net extracted from the layout. Also, a simulation of the net as extracted from the load schematic may be performed and then readily compared to a simulation of the same net extracted from the layout. Furthermore, besides capacitance and resistance, the inductance on a net may be readily incorporated in a load schematic. For example, the inductance on wire 114 may be taken into account in parasitics 120 of load schematic 210.

Figure 2:
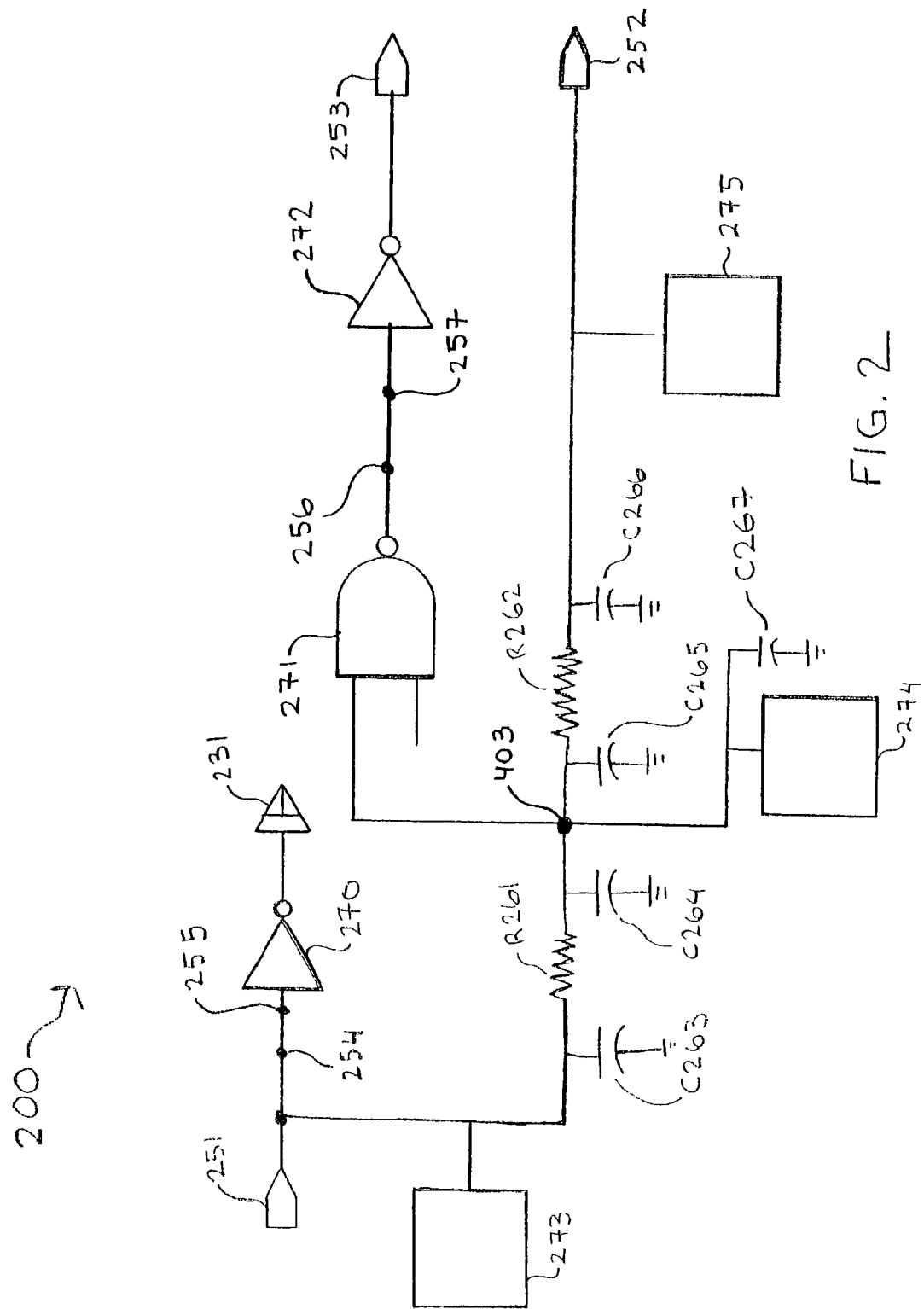
FIG. 2 shows a conventional simulation schematic.

Referring now to FIG. 2, there is shown a conventional simulation schematic 200 for a single net (hereinafter referred to as "net 251/252") having an entry point 251 and an exit point 252. As shown in FIG. 2, simulation schematic 200 also includes components 270–275, and parasitics R261, R262, C263, C264, C265, C266 and C267. Components 273–275 may be a single component, or a group of components. Component 271 is connected to a tap point 403. A terminator 231 may be placed after component 270 so that an IC design tool will not consider anything past component 270. In contrast, there may be additional components connected to an exit point 253. Because simulation schematic 200 is for simulating a single net, schematic 200 is supposed to accurately reflect the parasitics and loads on the net. As will be discussed below, this is not usually the case.

In FIG. 2, component 272 is included in simulation schematic 200 although component 272 is not really a load on net 251/252. Also, the wire between points 256 and 257 has been erroneously included in simulation schematic 200. It is relatively easy to make these schematic entry errors when the parasitics and loads on a net are not organized for easy identification and error checking.

Also in FIG. 2, the parasitics do not take into account stub parasitics, such as the capacitance and resistance between points 254 and 255.

Figure 3:
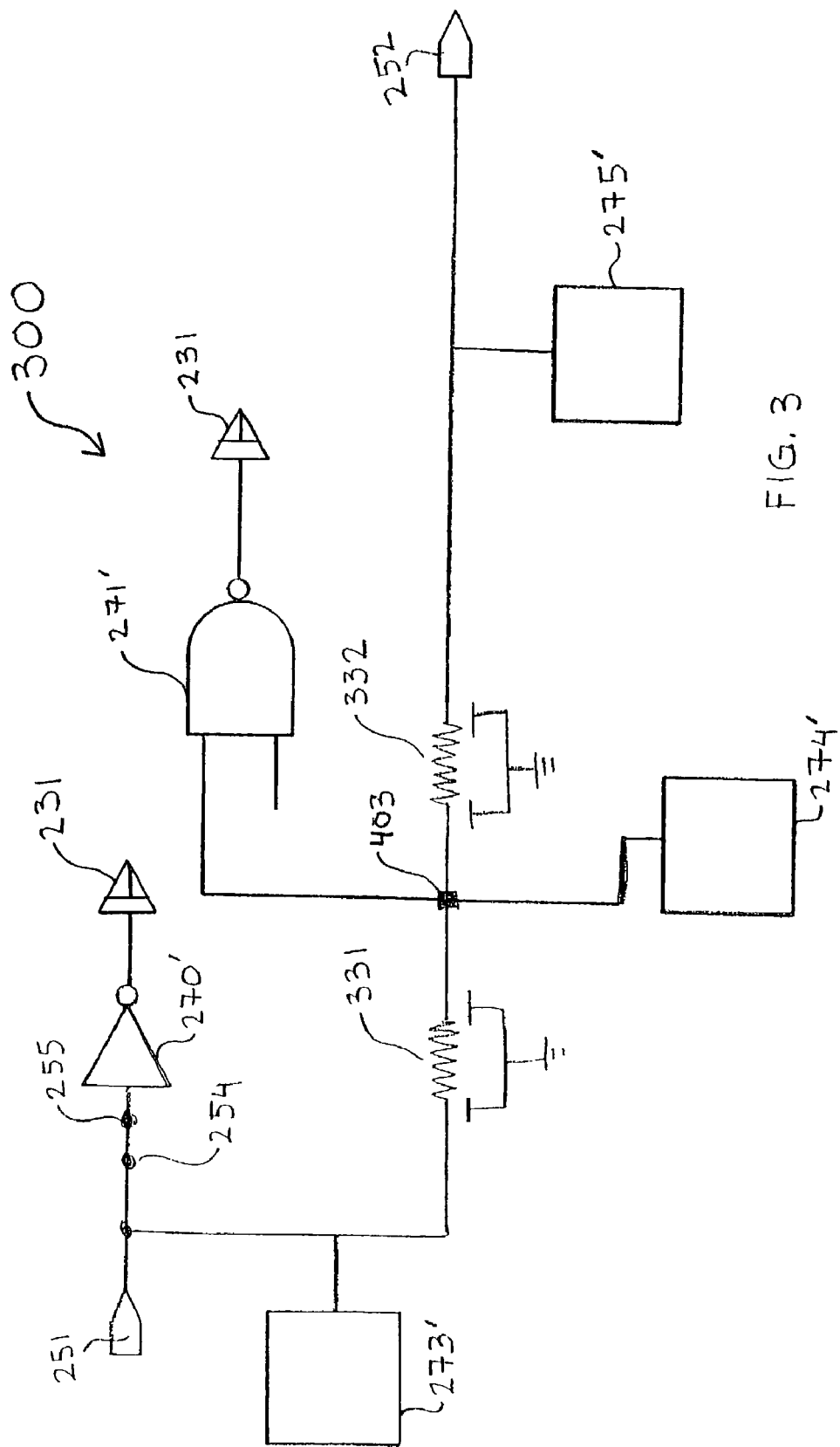
FIG. 3 shows a load schematic for a net in the simulation schematic of FIG. 2 in accordance with an embodiment of the present invention.

FIG. 3 shows a load schematic 300 in accordance with an embodiment of the present invention. Net 251/252 may be extracted from load schematic 300 for simulation and comparison purposes. As will be further described in connection with FIG. 4, load schematic 300 may also be incorporated in a higher-level simulation schematic. In FIG. 3, parasitics 331 and 332 represent the parasitic resistance and capacitance of net 251/252. Parasitics 331 and 332, which may be resolved into a pi network, may also take into account inductance on net 251/252 and stub parasitics between points 254 and 255. Components 270', 271', 273', 274', and 275' represent the equivalents of loads 270, 271, 273, 274, and 275 (see FIG. 2), respectively.

Also in FIG. 3, components that do not present a load on the net are not included. For example, comparing simulation schematic 200 to load schematic 300, load schematic 300 does not depict component 272 and the wire between points 256 and 257. In this particular embodiment, load schematic 300 only includes the parasitics and loads (as represented by equivalent loads) on net 251/252. This allows for relatively easy schematic entry and analysis of the net.

Figure 4:
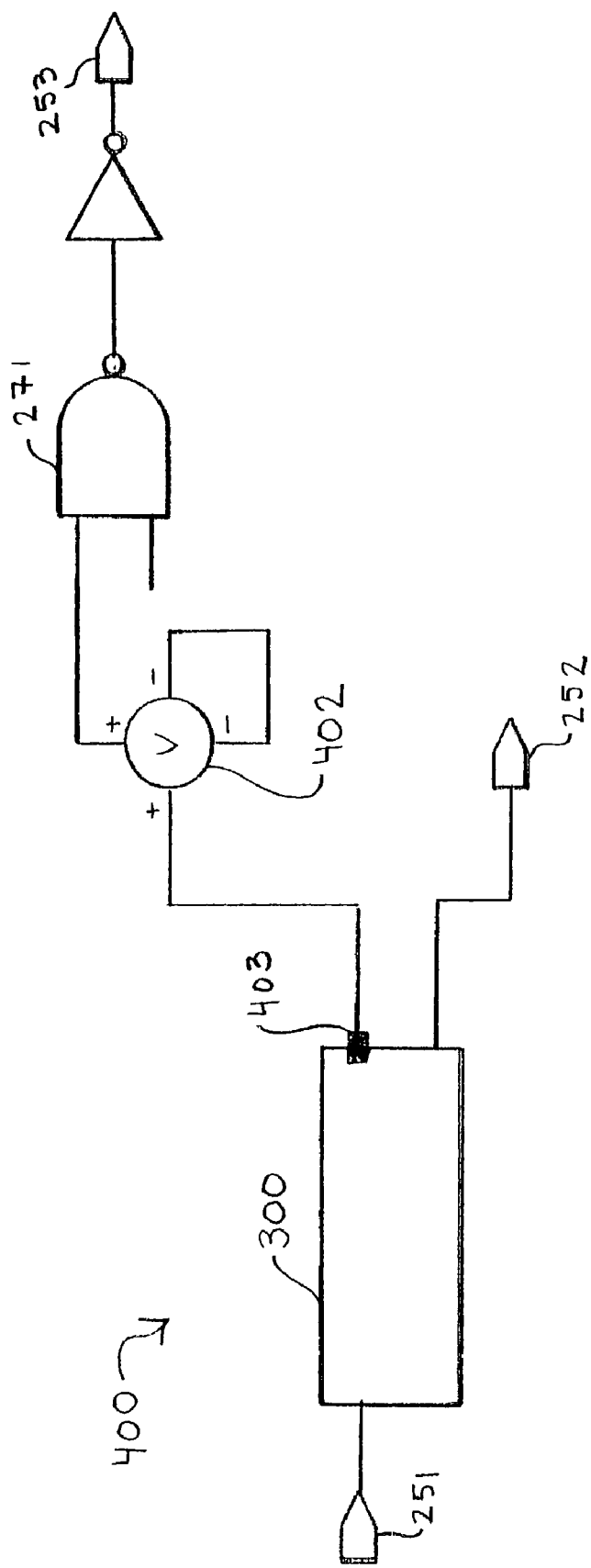
FIG. 4 shows a simulation schematic incorporating the load schematic of FIG. 3 in accordance with an embodiment of the present invention.

Referring now to FIG. 4, there is shown a simulation schematic 400 in accordance with an embodiment of the present invention. Simulation schematic 400 is a top-level schematic that includes the load schematic 300 of FIG. 3. In FIG. 4, load schematic 300 is depicted as a block having entry point 251, exit point 252, and tap point 403. Load schematic 300 is coupled to component 271 via a buffer 402, which in this example is a unity-gain voltage controlled voltage source. In FIG. 4, an additional buffer may be connected to exit point 252 to couple load schematic 300 to other loads. Note that the process of creating a load schematic for a net, and incorporating the load schematic in a simulation schematic may be repeated for other nets in a simulation schematic.

An IC design tool may be employed to generate a netlist for load schematic 300. Another netlist for net 251/252 may be extracted from a corresponding layout. Because load schematic 300 reflects the parasitics and loads on net 251/252, the netlist of load schematic 300 may be readily compared to the netlist extracted from the layout to check if the layout results in parasitics that are within design constraints (as reflected in load schematic 300).

Figure 5:
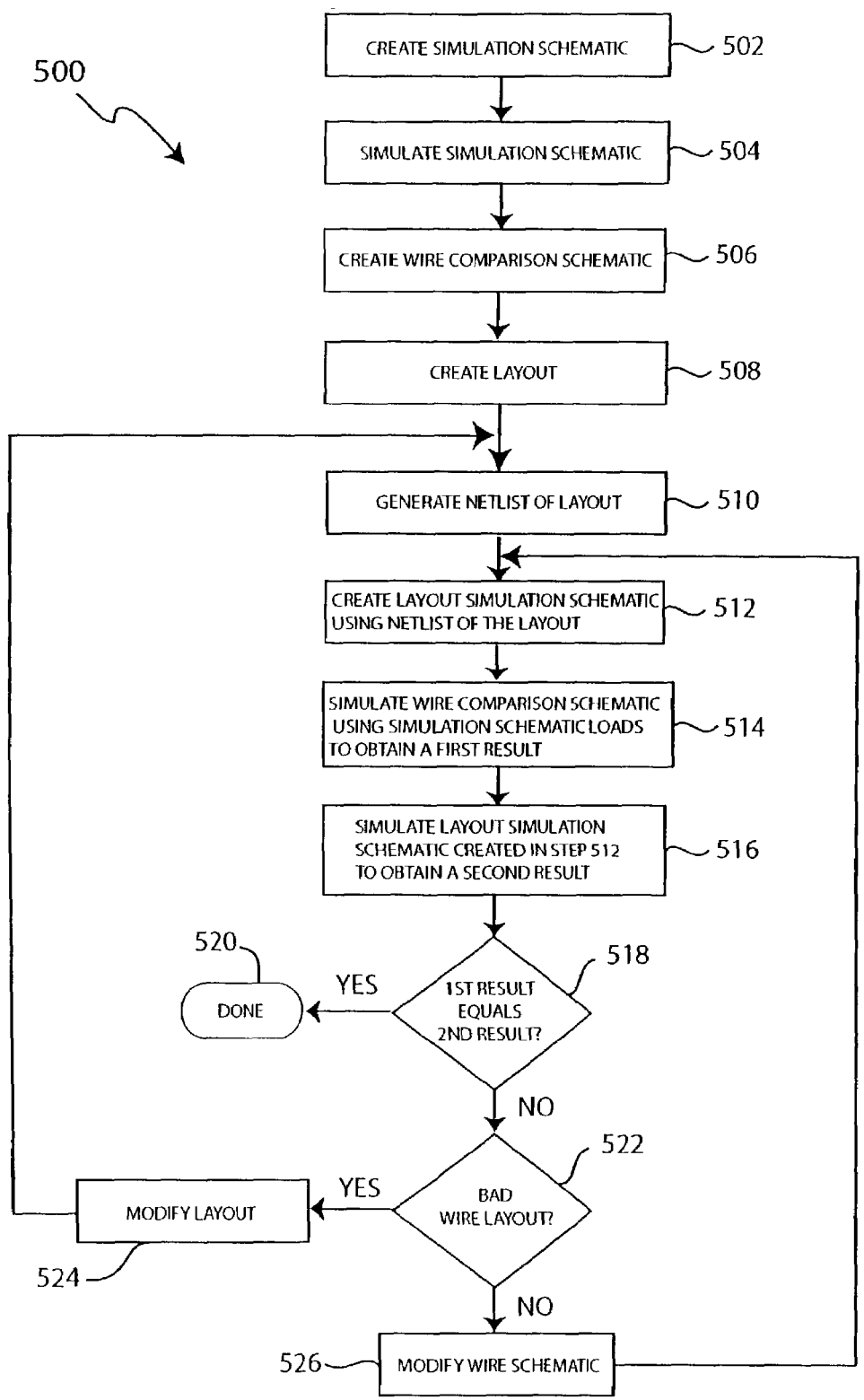
FIG. 5 shows a flow diagram of a method of verifying an integrated circuit design in accordance with an embodiment of the present invention.

FIG. 5 shows a flow diagram of a method 500 in accordance with an embodiment of the present invention. Method 500 may be employed in conjunction with an IC design tool to verify the design of an integrated circuit. IC design tools that may be employed include those available from Cadence Design Systems of San Jose, Calif.

In step 502, a simulation schematic is created for a circuit schematic. The simulation schematic includes a load schematic for each net to be simulated, and the loads on the net. The load schematic includes the parasitics and equivalent loads on each net. The parasitics may include estimated capacitance, resistance, inductance, or combination thereof that an engineer believes will be on a given net. An example simulation schematic created per step 502 is simulation schematic 400 shown in FIG. 4.

In step 504, the simulation schematic is simulated to see if the circuit schematic will operate per design constraints.

In step 506, a wire comparison schematic is created. A wire comparison schematic is a diagram depicting one or more interconnected simulation schematics. For example, a wire comparison schematic may have several simulation schematics 400, one for each net to be simulated. As can be appreciated, a wire comparison schematic is essentially a simulation schematic for one or more wires in an integrated circuit.

Figure 6B:
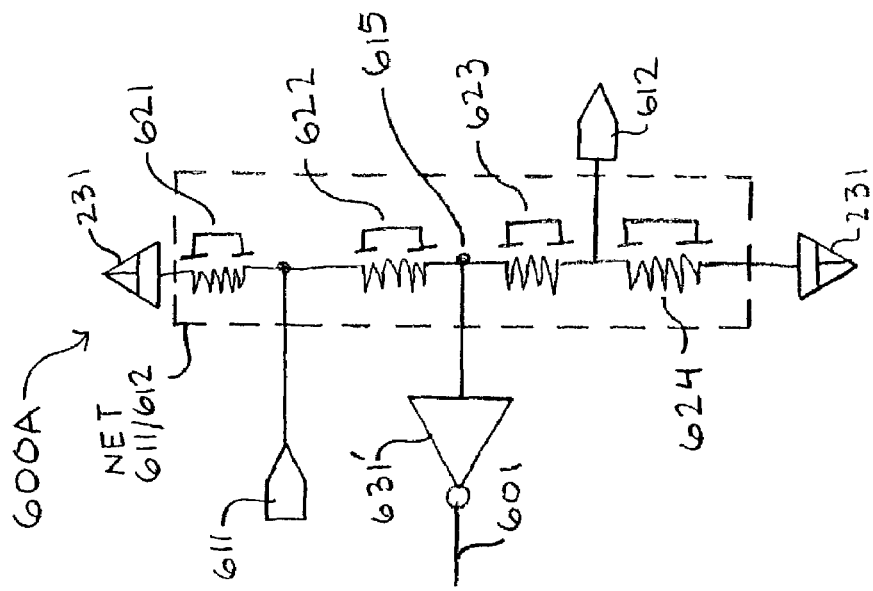
FIGS. 6A–6C illustrate an application involving latched keeper-type circuits.
Figure 6A:
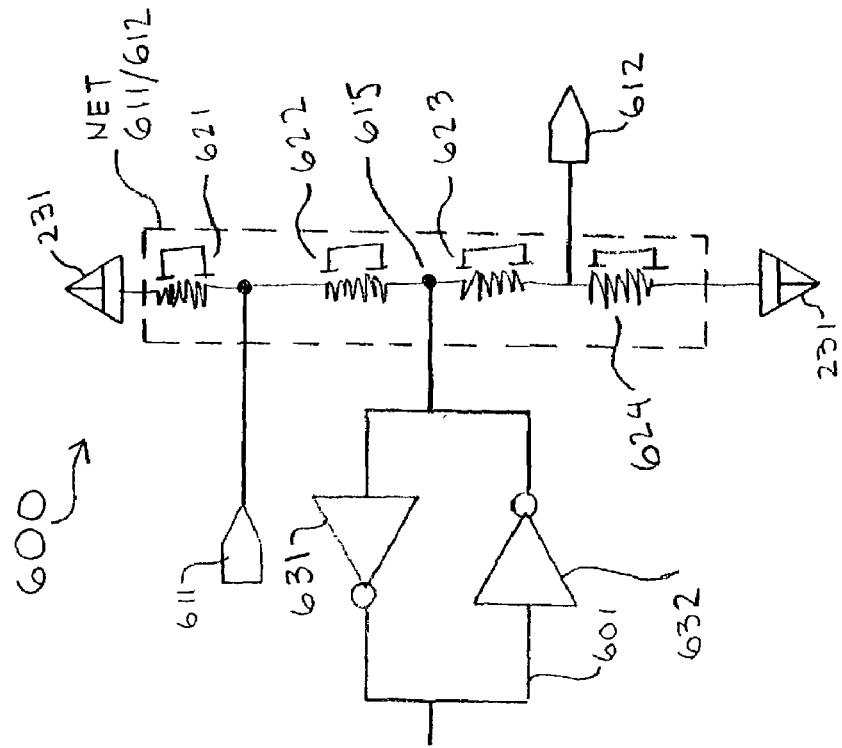
Figure 6C:
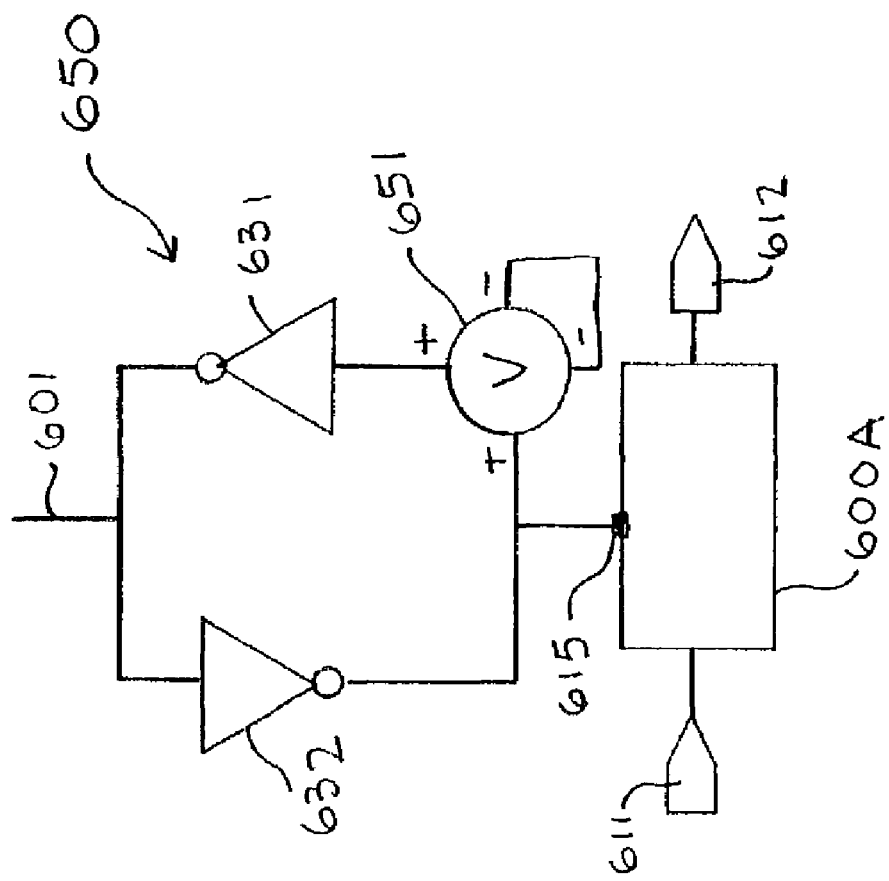
Figure 7:
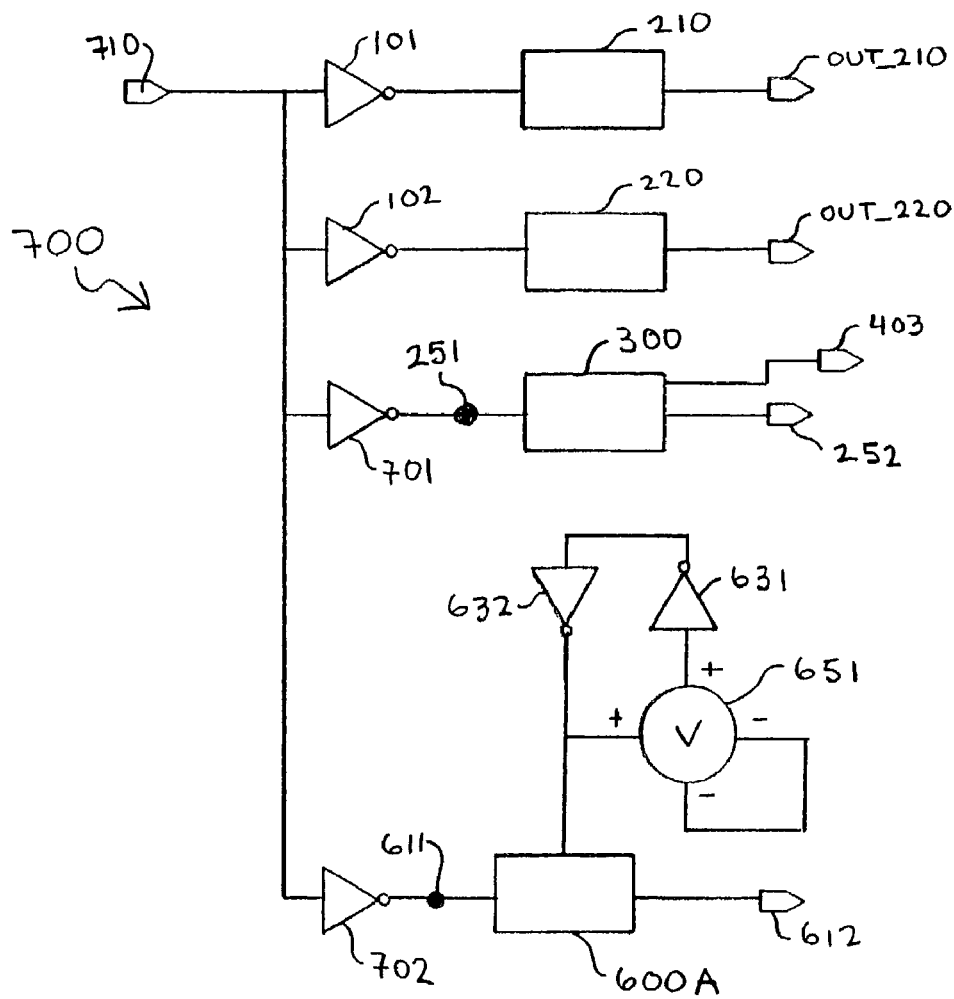
FIG. 7 shows a wire comparison schematic in accordance with an embodiment of the present invention.

FIG. 7 shows an example wire comparison schematic 700 in accordance with an embodiment of the present invention. Wire comparison schematic 700 includes load schematics 210 (see FIG. 1C), 220 (see FIG. 1C), 300 (see FIG. 4), and 600A (later discussed in connection with FIG. 6C). In the example of FIG. 7, inverters 101 (see also FIG. 1C), 102 (see also FIG. 1C), 701, and 702 buffer an input stimulus signal on entry point 710. Exit points out_210, out_220, 403, 252, and 612 allow a load to be coupled to their respective load schematics. Note that exit point out_210 may be a point on the input of buffer 201 of FIG. 1C, while exit point out_220 may be a point on the input of buffer 202. The components attached to load schematic 600A are later discussed in connection with FIGS. 6A–6C.

Continuing in step 508, a layout is created based on the circuit schematic. As is understood in the art, step 508 may also be performed in parallel with any or all of the preceding steps.

In step 510, a netlist of the layout is generated. The netlist of the layout may be generated by extracting one or more nets from the layout.

In step 512, a simulation schematic for the layout, hereinafter referred to as "layout simulation schematic", is created using the netlist of the layout. Note that depending on the IC design tool employed, the wire comparison schematic and the layout simulation schematic may be different views of the same schematic. For example, in IC design tools from Cadence Design Systems, step 512 may be performed by simulating a view of the netlist extracted from the layout.

In step 514, the wire comparison schematic created in step 506 is simulated using loads from the simulation schematic to obtain a first result.

In step 516, the layout simulation schematic is simulated to obtain a second result.

In step 518, the first result is compared to the second result. In other words, the result of simulating the wire comparison schematic is compared to the result of simulating the layout simulation schematic. As indicated in step 520, the process of verifying parasitics is completed if the two results are consistent. In other words, if the two simulations substantially agree for a given net, the simulation schematic for that net may be used with relatively high degree of confidence. If the two simulations do not agree, further investigation as to the cause of the inconsistency may be performed. For example, the accuracy of the simulation schematic may be increased until it is consistent with the layout as indicated in steps 522 and 526. As another example, the layout may be modified so that the parasitics resulting from the layout match the expected parasitics reflected in the simulation schematic as indicated in steps 522 and 524.

Figure 8:
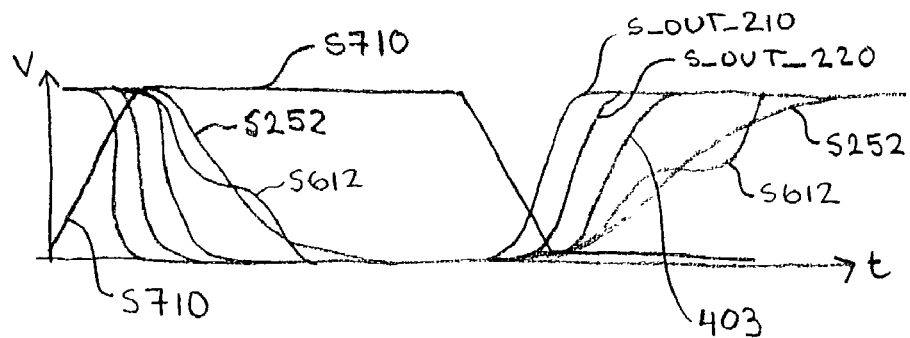
FIG. 8 shows examples of waveforms obtained by simulation.

FIG. 8 shows example waveforms resulting from simulating a wire comparison schematic (e.g., created in step 506 or 512). The waveforms of FIG. 8 resulted from simulating wire comparison schematic 700 shown in FIG. 7. In FIG. 8, waveform S710 is an input stimulus signal on entry point 710. In this example, waveform S710 is a signal for testing the LOW-to-HIGH and HIGH-to-LOW response of the wires represented by their respective load schematics. Waveforms S_OUT_210, S_OUT_220, S403 and S252, and S612 are waveforms from load schematics 210, 220, 300, and 600A, respectively, in response to waveform S710. Waveforms resulting from simulating a wire comparison schematic (or a simulation schematic for a single net) and a layout simulation schematic may be compared to determine if any particular net is behaving as expected.

In light of the present disclosure, those of ordinary skill in the art will appreciate that the invention may be adapted to work with various IC design tools. That is, embodiments of the invention may be modified to make a schematic more accurate, or to lower extraction or netlist generation time, for example. It is to be noted that these modifications will depend on the particular IC design too employed and will be readily apparent to those of ordinary skill in the art. Additionally, an IC design tool vendor may adapt its software to practice embodiments of the invention. Embodiments disclosed herein may be modified without deviating from the scope and spirit of the invention.

In situations where a load schematic for a net becomes relatively large, the load schematic may be divided into several, small "sub-load schematics". Each sub-load schematic may then be extracted and simulated separately, with the simulation results of the sub-load schematics being integrated together before being compared to a simulation of the net as extracted from the layout.

When the IC design tool employed to extract parasitics from a layout also extracts parasitics due to a driver component driving the net, the parasitics due to the driver component may be removed from the net's load schematic. This will prevent "double counting" of the driver parasitics, and will thus make the simulation schematic more consistent with the layout.

Some IC design tools only extract parasitics on a net and transistor capacitance attached to the net. With these tools, nets in so-called latched "keeper" circuits may not be properly extracted from the layout. That is, a net extracted from a layout may not match the same net extracted from a simulation schematic. Thus, with these tools, the engineer may have to be on the lookout for latched keeper circuits, and accordingly take this IC design tool limitation into account when creating a load schematic and a higher-level simulation schematic. This situation is further discussed with reference to FIGS. 6A–6C.

FIG. 6A shows a simulation schematic 600 for a net 611/612. Net 611/612 has an entry point 611 and an exit point 612. Net 611/612 has parasitics 621–624, and components 631 and 632. A feedback wire 601 connects components 631 and 632 as a latched keeper circuit.

In the example of FIG. 6A, component 631 is an inverter. However, component 631 may also be the input section of a register or other types of components or loads. Similarly, component 632 does not necessarily have to be an inverter. Component 632 may also be other types of components driving net 611/612 on a tap point 615.

As mentioned, some IC design tools may not extract wire 601 from a layout because wire 601 is not really part of net 611/612; wire 601 is part of another net. When using such tools, a netlist of the simulation schematic will include wire 601, but a netlist of the layout will not. One way to get around this tool limitation is to manually generate the netlist for a net that has a latched keeper circuit. Another way is illustrated with reference to FIG. 6B.

FIG. 6B shows a load schematic 600A in accordance with an embodiment of the present invention. Load schematic 600A is a load schematic for net 611/612 shown in FIG. 6A. Load schematic 600A includes parasitics 621–624, which may be estimates of resistance, capacitance, and inductance on the net. The only equivalent load included in load schematic 600A is that for component 631. Wire 601 and component 632 are reflected not in load schematic 600A, but in a higher-level schematic shown in FIG. 6C as simulation schematic 650. This allows for more consistency between the simulation schematic and the layout because neither the load schematic nor the layout will reflect the feedback wire associated with the latched keeper circuit. Instead, the feedback wire and the keeper circuit will be taken into account in the higher level simulation schematic.

FIG. 6C shows a simulation schematic 650 in accordance with an embodiment of the present invention. In FIG. 6C, load schematic 600A is depicted as a block having entry point 611, exit point 612, and tap point 615 as in FIG. 6B. A buffer 651, which in this example is a unity-gain voltage controlled voltage source, couples load schematic 600A to component 631. Simulation schematic 650 depicts the same circuit as simulation schematic 600 shown in FIG. 6A. In contrast to simulation schematic 600, however, extracting net 611/612 from simulation schematic 650 will yield the same netlist as when net 611/612 is extracted from a layout using a tool that will not extract wire 601.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A simulation schematic diagram comprising:
   a depiction of a buffer having an input and an output, the output of the buffer being coupled to a load on a net; and
   a load schematic comprising a depiction of a parasitic on the net coupled to an equivalent of the load, the load schematic being coupled to the input of the buffer;
   wherein the buffer comprises a voltage controlled voltage source.

2. The simulation schematic diagram of claim 1 wherein the parasitic comprises a capacitance.

3. The simulation schematic diagram of claim 1 wherein the parasitic comprises a capacitance, a resistance, and an inductance.

4. A method of verifying an integrated circuit design, the method comprising:
   creating a simulation schematic of a net, the simulation schematic depicting a load on the net;
   creating a load schematic, the load schematic depicting a parasitic on the net and an equivalent of the load;
   incorporating the load schematic in the simulation schematic; and
   buffering the load schematic from the load;
   wherein buffering the load schematic includes placing a representation of a voltage controlled voltage source between the load schematic and the load.

5. The method of claim 4 further comprising:
   creating a wire comparison schematic; and
   simulating the wire comparison schematic to obtain a first result.

6. The method of claim 5 further comprising:
   creating a layout of the net;
   creating a netlist of the layout;
   simulating the netlist of the layout to obtain a second result; and
   comparing the first result to the second result.

7. The method of claim 4 wherein the parasitic includes a capacitance and a resistance.

8. The method of claim 4 wherein the parasitic includes a capacitance, a resistance, and an inductance.

* * * * *